US008125007B2

(12) United States Patent
Anderson et al.

(10) Patent No.: US 8,125,007 B2
(45) Date of Patent: Feb. 28, 2012

(54) INTEGRATED CIRCUIT INCLUDING FINFET RF SWITCH ANGLED RELATIVE TO PLANAR MOSFET AND RELATED DESIGN STRUCTURE

(75) Inventors: Brent A. Anderson, Jericho, VT (US); Alvin J. Joseph, Williston, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 12/622,733

(22) Filed: Nov. 20, 2009

(65) Prior Publication Data

US 2011/0121369 A1 May 26, 2011

(51) Int. Cl.
*H01L 27/148* (2006.01)
(52) U.S. Cl. .................. 257/255; 257/265; 257/270
(58) Field of Classification Search .................. 257/255, 257/265, 270, 272
See application file for complete search history.

(56) References Cited

U.S. PATENT DOCUMENTS

| 4,673,831 | A | 6/1987 | Reppen |
| 5,786,722 | A | 7/1998 | Buhler et al. |
| 6,683,362 | B1 | 1/2004 | O et al. |
| 6,804,502 | B2 | 10/2004 | Burgener et al. |
| 6,815,277 | B2 | 11/2004 | Fried et al. |
| 6,911,383 | B2 | 6/2005 | Doris et al. |
| 7,101,763 | B1 | 9/2006 | Anderson et al. |
| 7,177,619 | B2 | 2/2007 | Nowak |
| 7,485,506 | B2* | 2/2009 | Doris et al. ................. 438/150 |
| 7,842,559 | B2* | 11/2010 | Jakschik et al. ............. 438/150 |
| 2005/0020020 | A1 | 1/2005 | Collaert et al. |
| 2008/0227241 | A1* | 9/2008 | Nakabayashi et al. ........ 438/150 |
| 2009/0101940 | A1* | 4/2009 | Barrows et al. ............... 257/204 |
| 2009/0236595 | A1* | 9/2009 | Atanackovic .................. 257/43 |

* cited by examiner

*Primary Examiner* — Phuc Dang
(74) *Attorney, Agent, or Firm* — Richard M. Kotulak; Hoffman Warnick LLC

(57) ABSTRACT

An integrated circuit (IC) includes a fin field effect transistor (FinFET) radio frequency (RF) switch; and a planar complementary metal-oxide semiconductor field effect transistor (MOSFET). The planar MOSFET has a channel on a <100> wafer plane and the FinFET RF switch has a channel on a <100> fin plane. The FinFET RF switch and the planar MOSFET can be oriented at approximately 45° with respect to one another.

12 Claims, 3 Drawing Sheets

INTEGRATED CIRCUIT INCLUDING FINFET RF SWITCH ANGLED RELATIVE TO PLANAR MOSFET AND RELATED DESIGN STRUCTURE

BACKGROUND

1. Technical Field

The disclosure relates generally to radio frequency (RF) switches, and more particularly, to an integrated circuit (IC) including a fin field effect transistor (FinFET) RF switch that is angled relative to a planar metal-oxide semiconductor FET (MOSFET), and a related design structure.

2. Background Art

Radio frequency (RF) switches are finding increased usage in integrated circuit (IC) chips used in a variety of devices. One illustrative device is a cell phone in which the antenna may need to be alternately coupled to different transmitters and receivers so as to isolate the relatively high power used for the transmitter(s) from the receiver(s) to prevent damage to the receiver(s). In addition, these switches allow connection to the receiver with very low loss. These RF switches are typically formed in semiconductor-on-insulator substrates because the buried insulator provides good isolation for the switching. Fin field effect transistors (FinFETs) are used in some cases to form RF switches.

Planar complementary metal-oxide semiconductor (CMOS) substrates, which are used for most devices, can also support FinFETs. One challenge relative to a FinFET RF switch on planar CMOS substrates is that they require very high mobility to obtain low losses without making the switch very wide (channel width), and lower capacitance to the substrate because it causes harmonic distortion. A current approach to address these issues is to generate an RF switch with a large number of fins.

BRIEF SUMMARY

A first aspect of the disclosure provides an integrated circuit (IC) comprising: a fin field effect transistor (FinFET) radio frequency (RF) switch; and a planar complementary metal-oxide semiconductor field effect transistor (MOSFET), wherein the planar MOSFET has a channel on a <100> wafer plane and the FinFET RF switch has a channel on a <100> fin plane.

A second aspect of the disclosure provides an integrated circuit (IC) comprising: a partially depleted semiconductor-on-insulator (PDSOI) substrate having a <100> surface orientation; a fin field effect transistor (FinFET) radio frequency (RF) switch on the PDSOI substrate, the FinFET RF switch including a plurality of fins; and a planar complementary metal-oxide semiconductor field effect transistor (MOSFET) on the PDSOI substrate, wherein the planar MOSFET has a channel on a <100> wafer plane and the FinFET RF switch has a channel on a <100> fin plane, and the FinFET RF switch and the planar MOSFET are oriented at approximately 45° with respect to one another.

A third aspect of the disclosure provides a design structure embodied in a machine readable storage medium for designing, manufacturing, or testing an integrated circuit, the design structure comprising a set of instructions defining: an integrated circuit (IC) including: a fin field effect transistor (FinFET) radio frequency (RF) switch; and a planar complementary metal-oxide semiconductor field effect transistor (MOSFET), wherein the planar MOSFET has a channel on a <100> wafer plane and the FinFET RF switch has a channel on a <100> fin plane.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
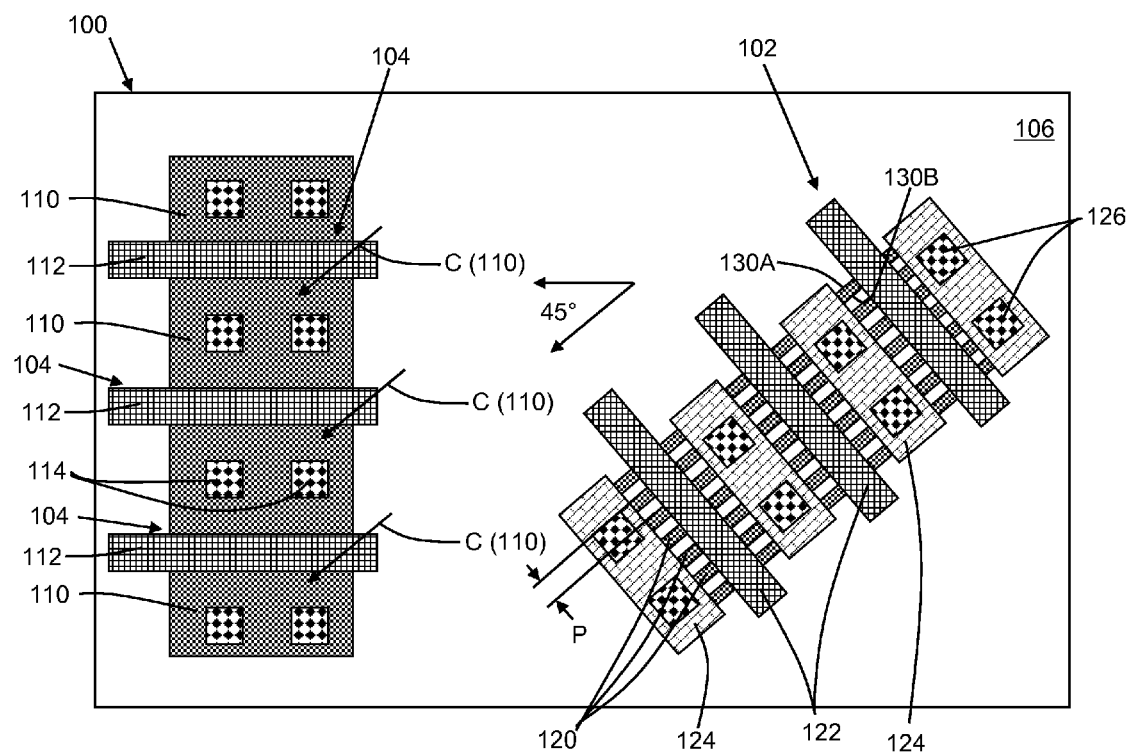
FIG. 1 shows a plan view of embodiments of an IC including a FinFET RF switch and planar MOSFET.

As indicated above, the disclosure provides an IC, including a FinFET RF switch that is angled relative to a planar MOSFET, and a related design structure. FIG. 1 shows a plan view of an integrated circuit (IC) 100 according to embodiments of the invention. IC 100 includes a fin field effect transistor (FinFET) radio frequency (RF) switch 102 and a planar metal-oxide semiconductor field effect transistor (MOSFET) 104 (three shown). Both FinFET RF switch 102 and planar MOSFET 104 are positioned on a semiconductor-on-insulator (SOI) substrate 106. In one embodiment, SOI substrate 106 has a surface orientation that is in the <100> direction. As used herein, "surface orientation" refers to the crystallographic structure or periodic arrangement of silicon atoms on the surface of a wafer. SOI substrate 106 may also include a partially depleted SOI substrate.

Planar MOSFET 104 may include any now known or later developed MOSFET device including, e.g., active regions 110, a gate 112 and a contact 114. The term "planar" indicates the layered nature of the structure. It is understood that other structures of planar MOSFET 104 not shown are readily understandable to one having ordinary skill in the art, and as such will not be described in detail herein. FinFET RF switch 102 may include a plurality of fins 120, which, as illustrated, extend substantially parallel to one another. FinFET RF switch 102 may also include at least one gate 122 coupling the plurality of fins together to form active regions along edges of the fins, and at least one strap 124 coupling the plurality of fins together. Contacts 126 to strap(s) 124 are also shown. It is understood that other structures conventionally used for FinFET RF switches and readily understandable to one with skill in the art are not shown for clarity.

It is understood that different surface orientations are optimal for different semiconductor devices that are arranged or positioned on a conventional manner. For example, an n-type field effect transistor (nFET) can be optimized by being generated on silicon having a <100> surface orientation, while a p-type FET (pFET) can be optimized by being generated on silicon having a <110> surface orientation. In addition, memory devices and nFETs are typically optimized when generated on semiconductor-on-insulator (SOI) substrates, while pFETs are typically optimized when generated on bulk silicon substrates.

In contrast to conventional structures, however, FinFET RF switch 102 is angled relative to MOSFET 104 on SOI substrate 106, which results in planar MOSFET 104 having a channel (under gate 112) on a <100> wafer plane and FinFET RF switch 102 having a channel (under gate 122) on a <100> fin plane. More particularly, as noted above, the flat top surface of SOI substrate 106 has a surface orientation in the <100> direction, i.e., a <100> directed silicon plane. MOSFET gates 112 are constructed on this <100> plane. In this case, current vector C from source to drain describes a vector in the <100> plane that is oriented in a (110) direction. If a fin is etched, viewed top down as in FIG. 1, to be in the same direction as the current vector C, then two sidewalls 130A, 130B of a resultant fin 120 describe new planes, perpendicular to the substrate surface. In this case, a channel 140 (FIG. 2) (edges of fins) for fins 120 describe surfaces that are <110> type planes, which have lower electron mobility. To obtain a fin sidewall plane of type <100>, fins 120 are oriented 45° degrees relative to the direction of the planar current vector C, or, to put it another way, the fin runs along a (100) vector in the <100> wafer plane in a top down view. Consequently, FinFET RF switch 102 and planar MOSFET 104 are oriented at approximately 45° with respect to one another; that is, with fins 120 at approximately 45° relative to gate 112. Sidewalls 130A, 130B of each fin 120 end up being <100> type planes in silicon as well as the flat surface of SOI substrate 106 for planar MOSFET 104.

Figure 2:
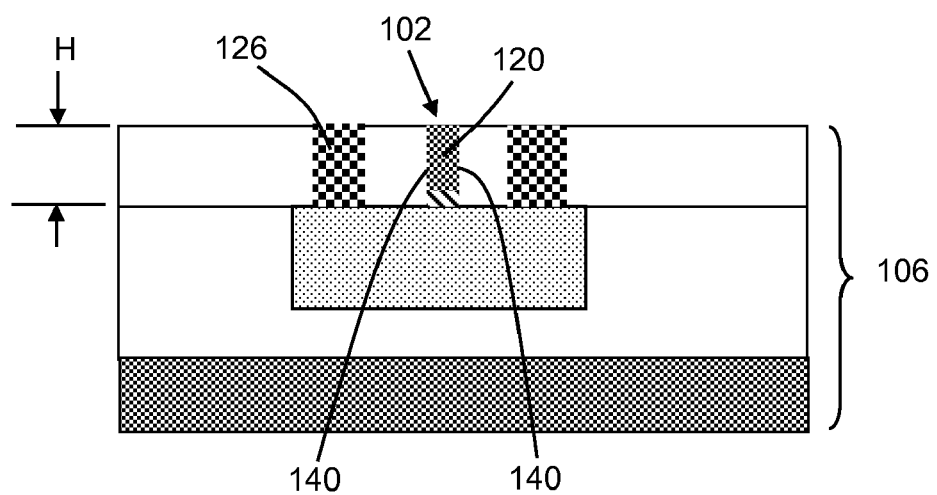
FIG. 2 shows a cross-sectional view of one fin of the FinFET RF switch of FIG. 1.

Referring to FIGS. 1 and 2 collectively, in one embodiment, fins 120 may have a height H (FIG. 2) that is greater than half of a pitch P (FIG. 1) between the plurality of fins, which improves the drive-to-substrate coupling.

Figure 3:
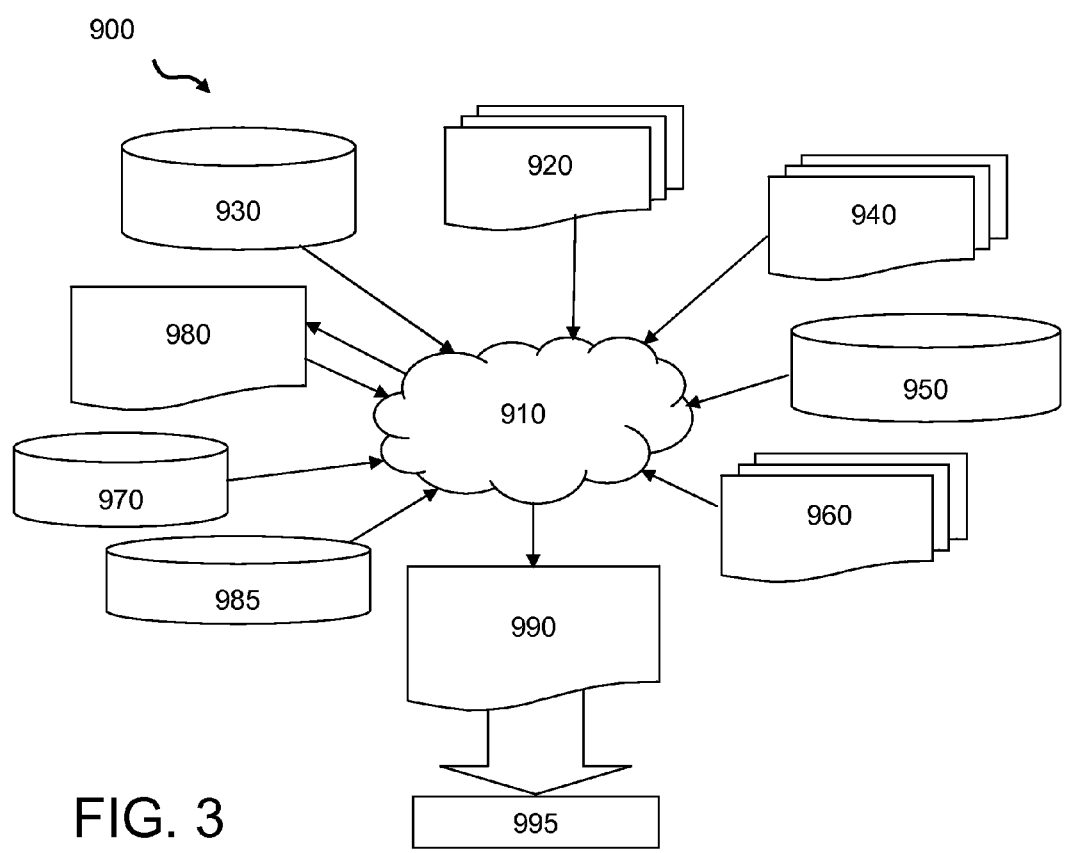
FIG. 3 shows a flow diagram of a design process used in semiconductor design, manufacture, and/or test.

The above-described IC 100 includes a PDSOI FinFET RF switch 102 having structure allowing use of high-mobility planes on sidewalls 130A, 130B with thick-fin fully depleted planar MOSFET 104. Since complementary metal-oxide semiconductor (CMOS) logic is typically positioned on a <100> plane wafer with devices oriented in the (110) direction, fabrication of fins 120 in an ortho-normal fashion results in an RF switch 102 with much lower mobility than a planar one, thereby degrading the isolation/insertion-loss. By aligning fins 120 on a {100} direction, a <100> faced fin 120 is presented, providing a best-possible FinFET RF switch 102. Consequently, an advantage of some of the embodiments is that FinFET RF switch 102 can be smaller and include fewer fins 120, yet provide better performance. In addition, FinFET RF switch 102 exhibits lower source/drain-to-substrate coupling FIG. 3 shows a block diagram of an illustrative design flow 900 used, for example, in semiconductor design, manufacturing, and/or test. Design flow 900 may vary depending on the type of IC being designed. For example, a design flow 900 for building an application specific IC (ASIC) may differ from a design flow 900 for designing a standard component. A design structure 920 may be an input to a design process 910 and may come from an intellectual property (IP) provider, a core developer, or other design company or may be generated by the operator of the design flow, or from other sources. Design structure 920 comprises a set of computer-executable instructions defining an embodiment of the invention as shown in FIGS. 1-2 in the form of schematics or, a hardware-description language (HDL) (e.g., Verilog, VHDL, C, etc.). Design structure 920 may be embodied on one or more machine readable media such as a computer-readable storage medium. For example, design structure 920 may be stored as a text file or a graphical representation of an embodiment of the invention as shown in FIGS. 1-2. Design process 910 may synthesize (or translate) an embodiment of the invention as shown in FIGS. 1-2 into a netlist 980, where netlist 980 is, for example, a list of wires, transistors, logic gates, control circuits, I/O, models, etc. that describes the connections to other elements and circuits in an integrated circuit design and is embodied on at least one of machine readable media. For example, the medium can be a storage medium such as a CD, a compact flash, other flash memory, or the like, or a transmission medium such as a packet of data to be sent via the Internet, or other networking suitable means. The synthesis may be an iterative process in which netlist 980 is re-synthesized one or more times depending on design specifications and parameters for the circuit.

Design process 910 may include using a variety of inputs; for example, inputs from library elements 930, which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure according to embodiments of the invention is not limited to any specific design flow.

Design process 910 preferably translates data representing an embodiment of the invention as shown in FIGS. 1-2, along with any additional integrated circuit design or data (if applicable), into a second design structure 990. Design structure 990 can be stored on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce a physical embodiment of the invention as shown in FIGS. 1-2. Design structure 990 can be utilized during a stage 995 where, for example, design structure 990, is provided to tape-out, is released to manufacturing, is released to a mask house, is sent to another design house, is sent back to the customer, etc.

The methods and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from cell phones, toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) comprising:
a fin field effect transistor (FinFET) radio frequency (RF) switch including:
a plurality of fins;
at least one gate coupling the plurality of fins together; and
at least one strap coupling the plurality of fins together; and
a planar complementary metal-oxide semiconductor field effect transistor (MOSFET),
wherein the planar MOSFET has a channel on a <100> wafer plane and the FinFET RF switch has a channel on a <100> fin plane.

2. The IC of claim 1, wherein the FinFET RF switch and the planar MOSFET are oriented at approximately 45° with respect to one another.

3. The IC of claim 1, further comprising a semiconductor-on-insulator (SOI) substrate having a <100> surface orientation upon which the FinFET RF switch and the planar MOSFET are positioned.

4. The IC of claim 3, wherein the SOI substrate is partially depleted.

5. The IC of claim 1, wherein the plurality of fins are oriented at approximately 45° with respect to a gate of the planar MOSFET.

6. The IC of claim 1, wherein each fin has a height that is greater than half of a pitch between the plurality of fins.

7. An integrated circuit (IC) comprising:
a partially depleted semiconductor-on-insulator (PDSOI) substrate having a <100> surface orientation;
a fin field effect transistor (FinFET) radio frequency (RF) switch on the PDSOI substrate, the FinFET RF switch including:
a plurality of fins;
at least one gate coupling the plurality of fins together; and
at least one strap coupling the plurality of fins together; and
a planar complementary metal-oxide semiconductor field effect transistor (MOSFET) on the PDSOI substrate,
wherein the planar MOSFET has a channel on a <100> wafer plane and the FinFET RF switch has a channel on a <100> fin plane, and the FinFET RF switch and the planar MOSFET are oriented at approximately 45° with respect to one another.

8. The IC of claim 7, wherein each fin has a height that is greater than half of a pitch between the plurality of fins.

9. A design structure embodied in a machine readable storage medium for designing, manufacturing, or testing an integrated circuit, the design structure comprising a set of instructions defining:
an integrated circuit (IC) including:
a fin field effect transistor (FinFET) radio frequency (RF) switch including:
a plurality of fins;
at least one gate coupling the plurality of fins together; and
at least one strap coupling the plurality of fins together; and
a planar complementary metal-oxide semiconductor field effect transistor (MOSFET),
wherein the planar MOSFET has a channel on a <100> wafer plane and the FinFET RF switch has a channel on a <100> fin plane.

10. The design structure of claim 9, wherein the design structure comprises a netlist.

11. The design structure of claim 9, wherein the design structure is stored in a data format used for the exchange of layout data of integrated circuits.

12. The design structure of claim 9, wherein the design structure includes at least one of test data, characterization data, verification data, or design specifications.

* * * * *